(12) United States Patent
Castle

(10) Patent No.: US 7,580,493 B2
(45) Date of Patent: Aug. 25, 2009

(54) ELECTRONIC CIRCUIT

(75) Inventor: Robert John Castle, Bristol (GB)

(73) Assignee: Hewlett-Packard Development Company, L.P., Houston, TX (US)

(*) Notice: Subject to any disclaimer, the term of this patent is extended or adjusted under 35 U.S.C. 154(b) by 678 days.

(21) Appl. No.: 11/191,731

(22) Filed: Jul. 28, 2005

(65) Prior Publication Data

US 2006/0023822 A1 Feb. 2, 2006

(30) Foreign Application Priority Data

Jul. 30, 2004 (GB) .................................. 0417140.1

(51) Int. Cl.
*H04L 7/00* (2006.01)
(52) U.S. Cl. ........................ 375/355; 375/360; 375/371; 375/374; 331/66; 368/156
(58) Field of Classification Search ................ 370/445; 331/66; 368/156; 375/355, 360, 371, 374
See application file for complete search history.

(56) References Cited

U.S. PATENT DOCUMENTS

| | | | |
|---|---|---|---|
| 5,761,255 A | 6/1998 | Shi | |
| 6,021,503 A | 2/2000 | Pax et al. | |
| 6,137,373 A | 10/2000 | Mori | |
| 7,339,854 B2* | 3/2008 | Ruffieux | ....................... 368/156 |
| 7,352,771 B2* | 4/2008 | Garber | ....................... 370/445 |
| 2002/0090044 A1 | 7/2002 | Lee et al. | |
| 2002/0126226 A1 | 9/2002 | Dudkowski | |
| 2004/0108907 A1* | 6/2004 | Lim et al. | ....................... 331/66 |

FOREIGN PATENT DOCUMENTS

| | | | |
|---|---|---|---|
| EP | 1271785 A | | 1/2003 |
| EP | 1351428 A | | 10/2003 |
| GB | 2136653 A | | 9/1984 |
| JP | 03041835 A | | 2/1991 |

OTHER PUBLICATIONS

European Search Report dated Oct. 19, 2005.

* cited by examiner

*Primary Examiner*—Sudhanshu C Pathak

(57) ABSTRACT

One embodiment of a method of generating a clock signal and synchronizing the generated clock signal with a digital data stream comprises generating a clock signal using an oscillator, identifying a transition in a portion of the data stream, and synchronizing a transition of the clock signal with the identified transition in the data stream by changing a state of the oscillator using control circuitry in response to the identification of the transition in the data stream, wherein the clock signal is synchronized with the data stream for both situations where the oscillator operates at a frequency greater than the data rate and where the oscillator operates a frequency less than the data rate. Other methods and systems are also provided.

5 Claims, 13 Drawing Sheets

ELECTRONIC CIRCUIT

CLAIM TO PRIORITY

This application claims priority to copending United Kingdom utility application entitled, "Electronic Circuit," having Ser. No. GB 0417140.1, filed Jul. 30, 2004, which is entirely incorporated herein by reference.

TECHNICAL FIELD

The present disclosure relates to electronic clock signal generation and synchronization.

BACKGROUND

Digital electronic circuits require clock signals in order that data sent from and received by the circuits may be processed in a specific sequence for correct recovery. In general, such clock signals are generated using crystal oscillator (XO) circuits.

These XO circuits, which may also include temperature compensation functionality, are notionally large circuits comprising, amongst other things, a number of elements including capacitors, resistors, inductors and transistors. These elements occupy a large area.

Under certain conditions, the inclusion of such a notionally large XO circuit in a circuit will be undesirable, particularly in circumstances where space is at a premium. In addition, the relatively large power requirements of such circuits make them undesirable in situations where there are power constraints such as in mobile devices for example.

A further problem arises in that the frequency of a clock signal generated using a clock circuit must be synchronized with the frequency of an incoming data stream in order that data may be correctly recovered. This is generally accomplished by oversampling the incoming data stream and using some form of digital signal processing to determine the samples which best represent the actual data.

Alternatively, the synchronization of the clock and incoming data frequencies may be effected using a phase-locked loop arrangement, wherein the difference in frequency between the input signal and a variable frequency oscillator providing a variable frequency clock signal provides a control signal operable to facilitate synchronization of the frequencies.

Both synchronization arrangements require significant space for implementation on a digital integrated circuit (IC), and have relatively high power requirements, which may be undesirable in situations where area and power are limited.

SUMMARY

According to one embodiment, among others, of the present disclosure, there is provided a method of generating a clock signal and synchronizing the generated clock signal with a digital data stream comprising generating a clock signal using an oscillator, identifying a transition in a portion of the data stream, and synchronizing a transition of the clock signal with the identified transition in the data stream by changing a state of the oscillator using control circuitry in response to the identification of the transition in the data stream, wherein the clock signal is synchronized with the data stream for both situations where the oscillator operates at a frequency greater than the data rate and where the oscillator operates a frequency less than the data rate.

According to another embodiment of the present disclosure, there is provided an embodiment of a digital electronic circuit comprising an oscillator adapted to generate a clock signal, wherein the circuit is operable to identify a transition in a portion of a received digital data stream, the circuit further operable to synchronize a transition of the clock signal with the identified transition in the data stream by changing a state of the oscillator in response to the identification of the identified transition in the data stream, wherein the clock signal is synchronized with the data stream for both situations where the oscillator operates at a frequency greater than the data rate and where the oscillator operates a frequency less than the data rate.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWINGS

For a better understanding of the present disclosure, and to further highlight the ways in which it may be brought into effect, various embodiments will now be described, by way of example only, with reference to the following drawings in which.

DETAILED DESCRIPTION

According to one aspect of the present disclosure, there is provided an embodiment of a method of generating a clock signal and synchronizing the generated clock signal with a digital data stream comprising generating a clock signal using an oscillator, identifying a transition in a portion of the data stream, and synchronizing a transition of the clock signal with the identified transition in the data stream by changing a state of the oscillator using control circuitry in response to the identification of the transition in the data stream.

According to another aspect of the present disclosure there is provided an embodiment of a method of generating a clock signal for use by an inductively powered circuit, and synchronizing the generated clock signal with a digital data stream comprising generating a clock signal using an oscillator, identifying a transition in a portion of the data stream, and synchronizing a transition of the clock signal with the identified transition in the data stream by changing a state of the oscillator using control circuitry in response to the identification of the transition in the data stream.

According to another aspect of the present disclosure, there is provided an embodiment of a digital electronic circuit comprising an oscillator adapted to generate a clock signal, wherein the circuit is operable to identify a transition in a portion of a received digital data stream, the circuit further operable to synchronize a transition of the clock signal with the identified transition in the data stream by changing a state of the oscillator in response to the identification of the identified transition in the data stream.

According to another aspect of the present disclosure, there is provided an embodiment of a digital electronic circuit comprising a timing element for generating a clock signal for the circuit, and a controller for synchronizing the clock signal with a received digital stream in response to an identification of a transition in the digital data stream.

According to another aspect of the present disclosure, there is provided an inductively powered circuit adapted to receive a digital data stream, the circuit comprising a timing element for generating a clock signal for the circuit, and a controller for synchronizing the clock signal with at least a portion of the received digital stream in response to an identification of a transition in the digital data stream.

Figure 1:
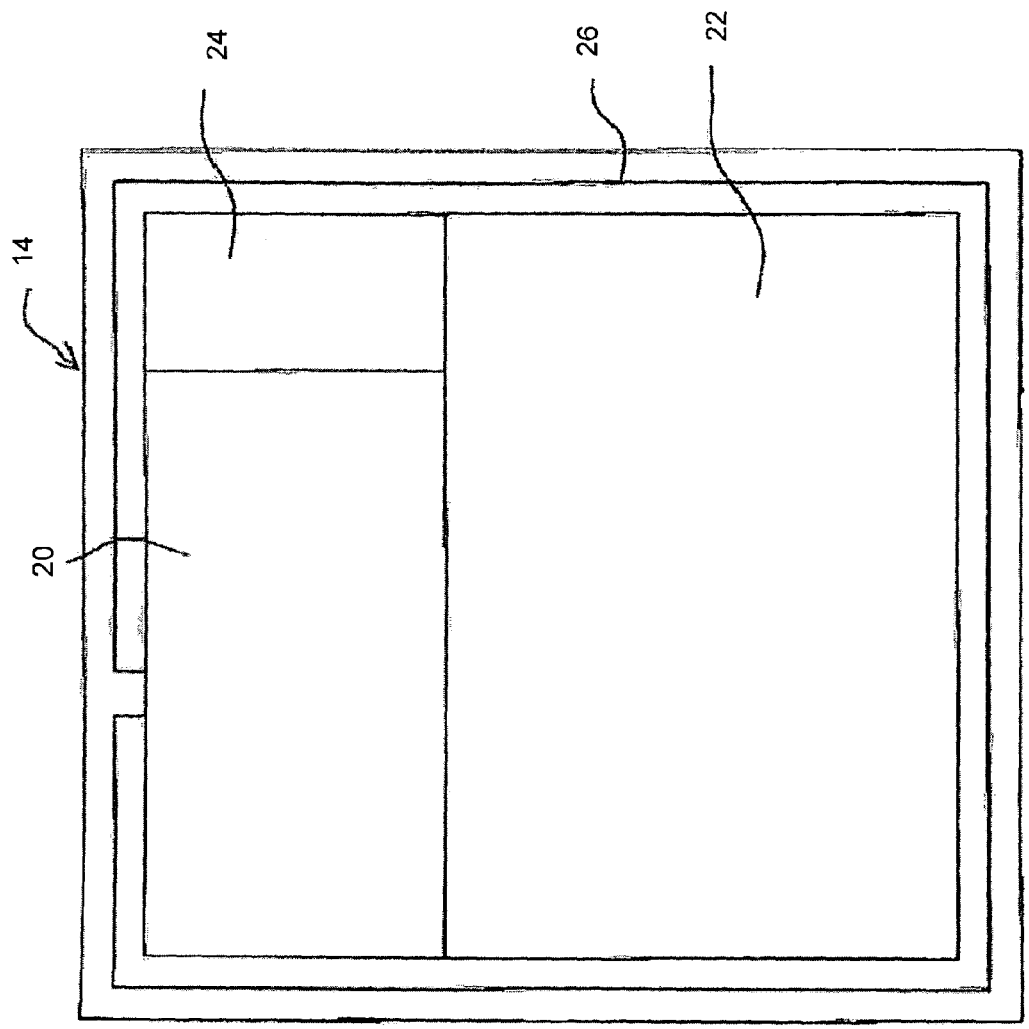
FIG. 1 illustrates an RFID memory tag suitable for use in the embodiments of the disclosure.

FIG. 1 of the accompanying drawings is a schematic representation of an exemplary memory tag. The memory tag 14 is an RFID memory tag provided on a chip, and comprises an RFID transponder circuit 20, a memory 22, a power supply capacitor 24 and an antenna coil 26 having only a few turns e.g. five, or as in this case a single turn. In an embodiment, the RFID transponder circuit 20 operates at 2.45 GHz, and is of an area of approximately 0.5 mm². The memory 22 provides 1 Mbit of capacity of non-volatile memory and is of an area of approximately 1 mm², and uses FRAM (ferroelectric random access memory) or MRAM (magnetoresistive random access memory) or similar memory technology requiring low power. The memory tags 14 are of a substantially square shape in plan view with an external dimension D for their sides of around 1 mm.

Figure 2:
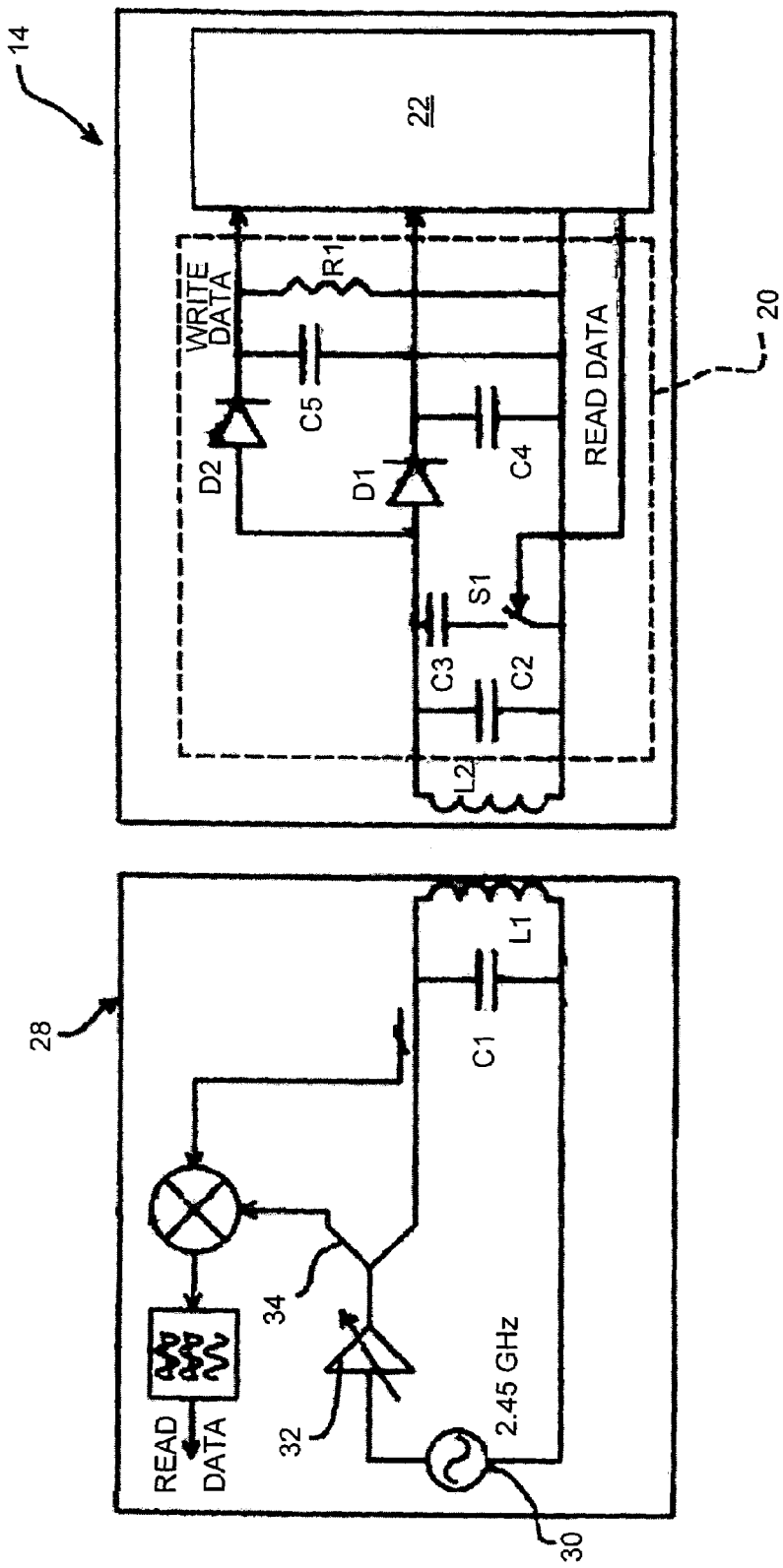
FIG. 2 illustrates the circuitry of the memory tag of FIG. 1 and of a read/write device for wireless communication with the memory tag.

Referring now to FIG. 2, the circuitry of a memory tag 14 and exemplary circuitry 28 of a read/write device (not shown) are illustrated schematically, using conventional component identifications (C-capacitor, L-inductance, R-resistor, D-diode and S-switch). In an embodiment, the RFID transponder circuit 20 of the memory tag 14 comprises a capacitor C2 which, in combination with the antenna coil L2(26), forms a resonant circuit with component values being chosen to tune the combination to approximately 2.45 GHz for inductive coupling with a read/write device. The portion of transponder circuit 20 responsible for power supply is diode D1 and capacitor C4(24), with diode D1 rectifying the alternating current generated by the inductive coupling and the capacitor C4 acts as a power supply storage. The portion of the transponder circuit 20 responsible for receiving transmitted data from a read/write device is diode D2, capacitor C5 and resistor R1 which form a simple envelope detector; the data thus received is stored in memory 22. The portion of the transponder circuit 20 responsible for the reading of data from the memory 22 is the tuned circuit L2/C2 in combination with S1 and C3, switching C3 in and out of the circuit using S1 changes the resonance of tuned circuit L2/C2 resulting in phase modulation of the reflected power from the memory tag 14 to a read/write device.

Circuit 28 is suitable for use in a read/write device and is operable to effect reading and writing of data to and from the memory tag 14. Read/Write circuit 28 comprises a signal generator 30, which generates a signal at the chosen frequency of 2.45 GHz. For transmitting data to the tag 14, this signal passes via an amplitude modulator 32, where it is amplitude modulated with data to be written to the memory tag 14, and a splitter 34, to an antenna L1 and capacitor C1 which form a tuned circuit. The component values of L1 and C1 being chosen to tune it to 2.45 GHz, as for the tuned circuit in the memory tag 14, in order to maximize inductive coupling between the two circuits, and thus transmission of power and data to and from the memory tag 14.

Although the memory tags 14 described above operate at 2.45 GHz, it should be understood that memory tags operating at other frequencies may be used. Factors affecting the choice of operating frequency for the memory tags are: a) government regulations concerning radio frequency transmissions; b) adequate bandwidth (consistent with government regulations); c) frequency high enough to render the physical size of components in the memory tag small enough to keep the area of silicon required low (and hence the cost to manufacture low); d) frequency low enough to provide adequate performance when using low-cost high-volume CMOS technology to manufacture the memory tag.

It should further be appreciated that memory tags of this functional type can be produced without using RFID technology. For example, optical technologies can be used to power, read and write to memory tags, as described in the applicant's earlier British Pat. Application No. 0227152.6, which is hereby incorporated in its entirety.

The read/write device comprises at least circuit 28, but can include additional functionality. For example, circuit 28 can be adapted for passing a data signal to a computer or other suitable device such as a mobile telephone, or PDA and the like to which the read/write device is connected, for subsequent data processing.

In order for the device 14 to be able to effectively transmit and receive data as described above, it requires a clock signal so that data received by and transmitted from the device is suitably synchronized with that of the device 28 for example.

Figure 3:
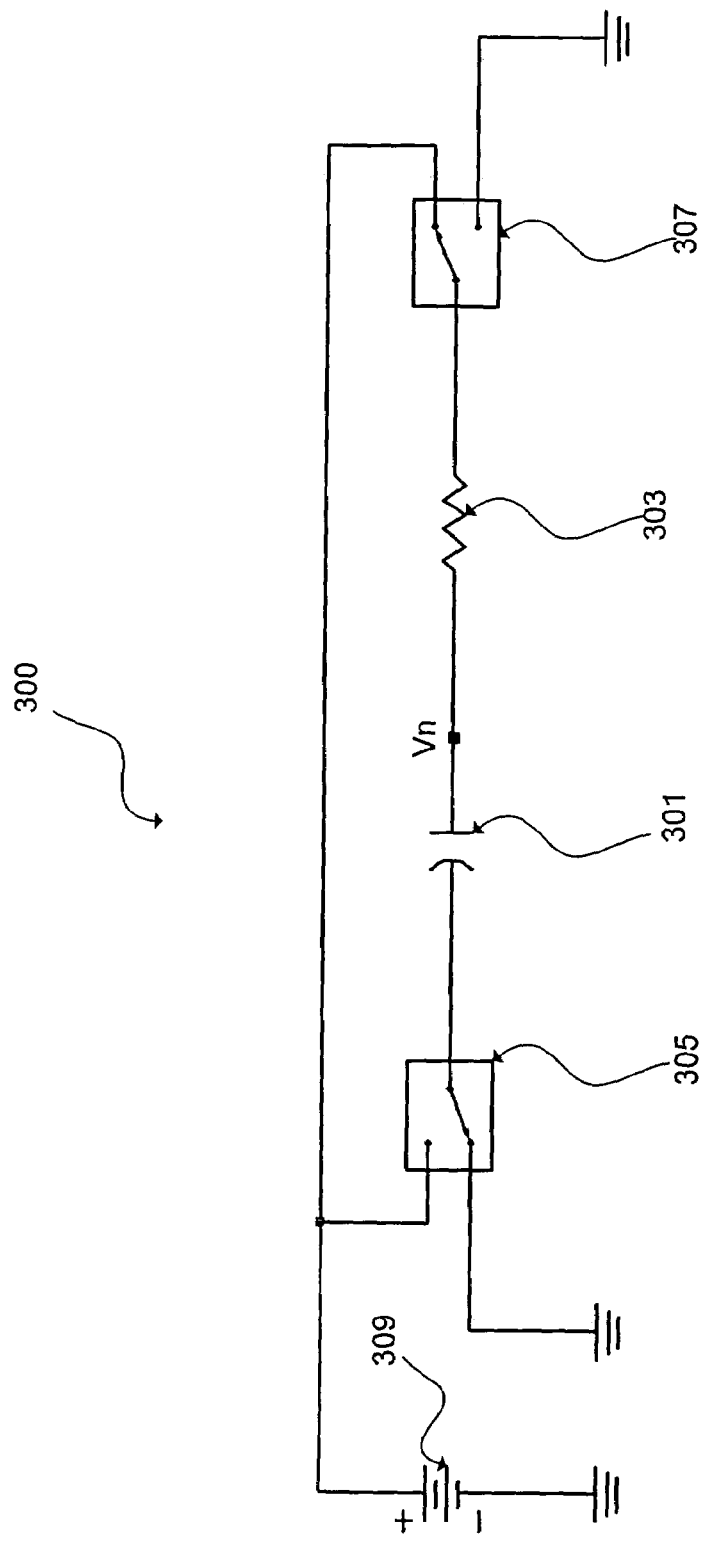
FIG. 3 is a schematic representation of an oscillator circuit according to an embodiment.

FIG. 3 of the accompanying drawings is a schematic representation of part of an oscillator circuit configuration in accordance with an embodiment. The circuit 300 includes a capacitor 301 and a resistor 303 in series and both arranged between two switches 305, 307. The switches 305, 307 can be single-pole double-throw switches for example, constructed using standard metal oxide semiconductor field effect transistor (MOSFET) technology. Other alternatives are possible.

The exemplary circuit diagram of FIG. 3 includes ground (0V) connections and a power supply (Vdd) 309. The power for the supply line Vdd can be provided using conventional means such as a battery for example. The voltage at a node, Vn, located at a point in between resistor 303 and capacitor 301 will be considered.

From an initial uncharged state, and with the switches 305, 307 in the positions shown in FIG. 3, capacitor 301 will gradually charge through the resistor 303. When the voltage on the capacitor 301 reaches a certain threshold value, Vt, the position of the switches 305, 307 are operable to change so that resistor 303 is grounded, and capacitor 101 is suddenly connected to the positive power supply. A suitable implementation which facilitates the switching according to one embodiment will be described in more detail below.

The above-described configuration is effectively a high pass filter receiving a step input of magnitude Vdd, with the output of the filter, at the node Vn, following the step by jumping up from the threshold voltage value Vt by the same amount, but then decaying away as a high pass filter cannot sustain a DC level.

Once the voltage at the node Vn reaches the threshold Vt again, this time on its downward path, the position of the switches 305, 307 are operable to change once more to that shown in FIG. 1. This configuration can also be considered as a high pass filter receiving a step input, except that "ground" is now actually at the supply voltage and the step is negative. Once more the voltage at the node Vn will follow the step and then be unable to sustain the DC level. It will therefore start to rise, reach the threshold voltage value Vt, and the whole process repeats, resulting in an oscillation. Each of the switches 305, 307 of FIG. 3 are constructed as a pair of transmission gates with control signals arranged to ensure that when one is open the other is closed.

Figure 4:
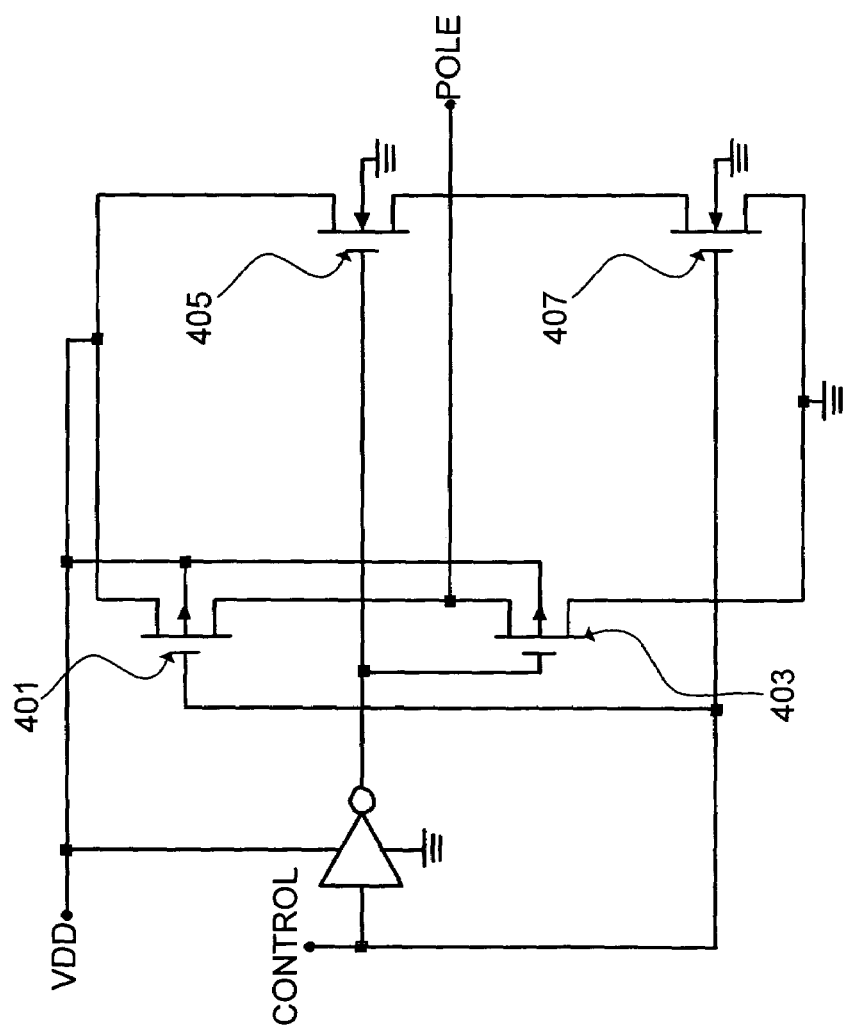
FIG. 4 is a schematic representation of a switch circuit.

FIG. 4 is a schematic representation of a suitable switch arrangement. Advantageously, each switch 305, 307 of FIG. 3 is arranged as shown in FIG. 4. Specifically, four MOSFET devices 401, 403, 405 and 407 are arranged as shown in FIG. 4. In the embodiment of FIG. 4, devices 401, 403 are p-channel MOSFET devices (PMOS), and devices 405, 407 are n-channel MOSFET devices (NMOS), however it will be appreciated by those skilled in the art that alternative arrangements are possible which have substantially the same functionality.

Figure 5:
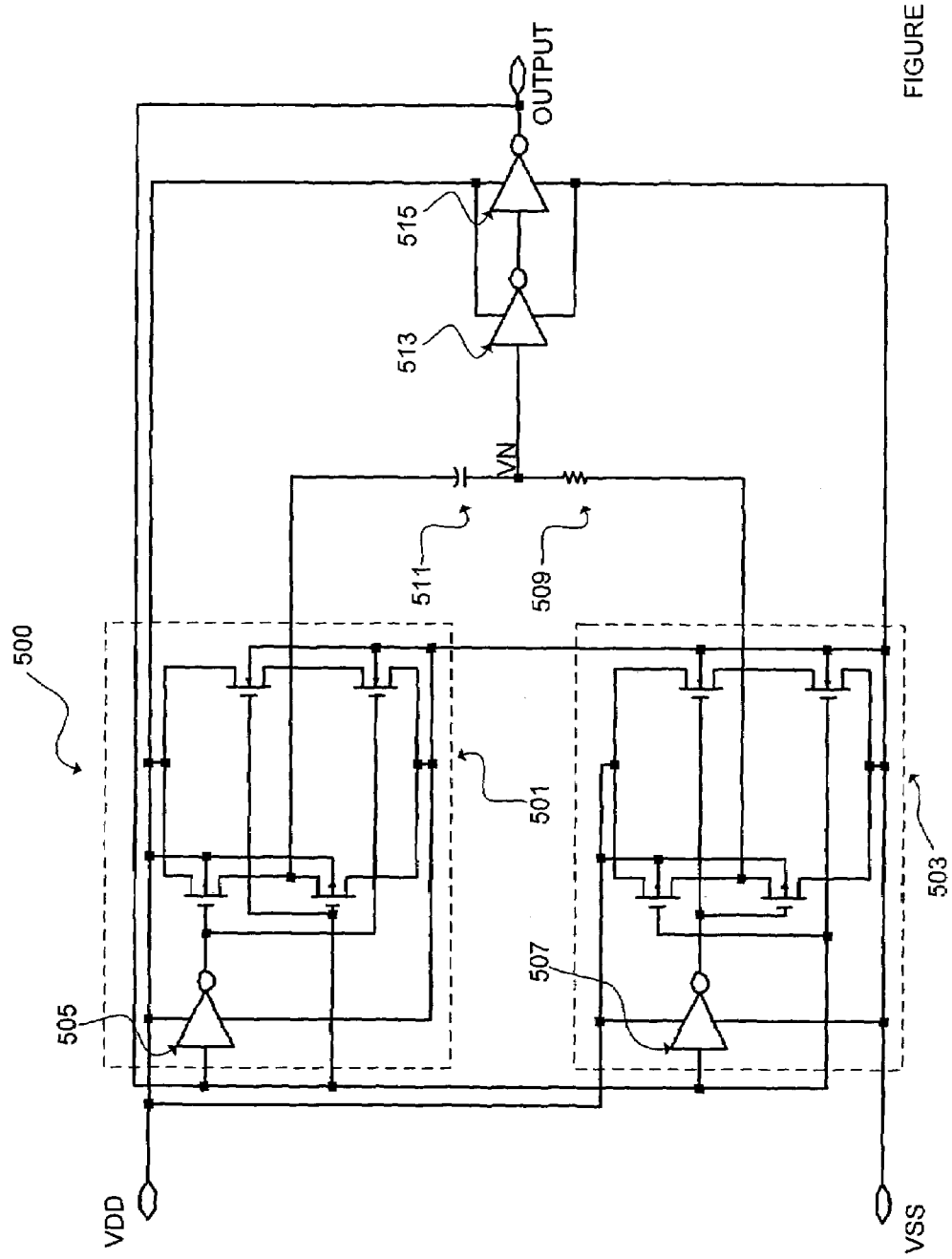
FIG. 5 is a further schematic representation of an oscillator circuit.

FIG. 5 of the accompanying drawings is a schematic representation of an oscillator circuit configuration including switch functionality in accordance with an exemplary embodiment. The circuit comprises the transmission gate switches 501, 503 with, in each case, an inverter 505, 507 connected to a different pair of MOSFETs of each of the switches 501, 503. This ensures the reciprocal switching between Vdd and 0V of each end of the resistor/capacitor (RC) combination. The resistor 509 and capacitor 511 in the center of the circuit are time constant components which determine the frequency of oscillation. The components provide a timing element of the circuit, and determine the period of a clock signal generated by the circuit 500.

In one embodiment, the output of a node of the RC combination Vn, is buffered through two standard inverters 513, 515. These cascaded inverters 513, 515 provide the necessary functionality in order to buffer the node Vn and prevent loading of the oscillator as a result of the capacitive load which would be introduced to the oscillator if it were connected directly to the rest of the circuit. The inverters 513, 515 provide the added advantage that they provide a rapidly switching threshold comparison, thereby obviating the need for a separate comparator stage.

The voltage at a node Vn of FIG. 5 will oscillate at a frequency which is determined by the values of the elements 509 and 511. The oscillator period can therefore be tuned by appropriate selection of values for the elements 509, 511.

Therefore, a clock signal can be derived from the oscillator circuit of FIG. 3, whose period is determined by a timing element of the circuit of FIG. 3, which timing element comprises, in an embodiment, at least the resistor-capacitor combination arranged as shown, and which is arranged in association with the circuitry as depicted diagrammatically in FIGS. 4 and 5.

It is necessary to ensure that the clock signal derived from the oscillator which has been generated as described above is synchronized with an incoming data stream in order to be able to correctly recover data associated with the data stream. For example, a clock signal generated as described above and used by a memory tag of FIG. 1 must be synchronized with data received by the tag in order for it to be correctly recovered. In this respect the derived clock signal must be substantially aligned with edges of the incoming data stream. In one embodiment, there is one clock cycle per bit period of an incoming data stream, and synchronization will result in a clock transition near the center of a bit which is advantageous for latching the data. In one embodiment, a suitable clock signal is derived from the oscillator signal using a divide-by-2 function. The divide-by-2 function is preferably implemented using a D flip flop with the inverted output connected to the input, in one embodiment.

While the oscillator as described above is running in order to generate a clock signal, and a data stream is being received by a circuit using the generated clock signal, there are two possible situations which may arise. Firstly, a transition in the data stream of the incoming data may occur while the clock signal is in a low state, or alternatively, a transition may occur while the clock signal is in a high state. Such a transition may be either a rising edge transition or a falling edge transition.

In the first case, in which a transition in the data stream of incoming data occurs while the clock is in a low state, a controller is operable to make the oscillator change state so that there will be a positive transition in the derived clock signal as soon as practicable after the start of the bit period. The next clock transition (falling edge transition) will then be near the center of the bit, which is advantageous for sampling and latching the data.

To force the oscillator to change state to make this transition in the clock signal, an adjustment MOSFET is used in one embodiment. In this connection, FIG. 6 of the accompanying drawings is a schematic representation of an oscillator circuit configuration. The circuit 600 of FIG. 6 includes two additional elements 601, 603. Element 601 is a p-channel MOSFET (PMOS), and element 603 is an n-channel MOSFET (NMOS).

Figure 6:
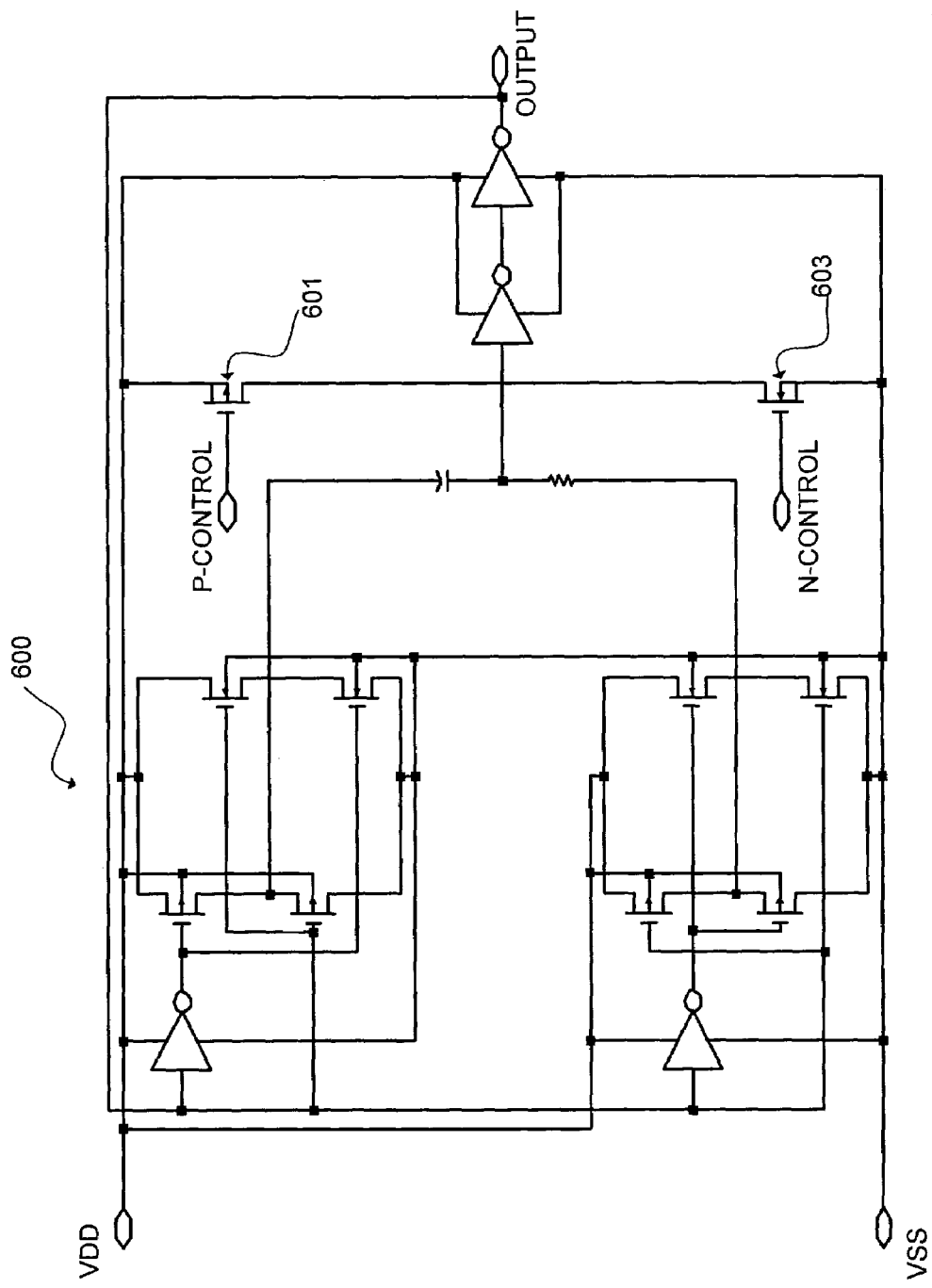
FIG. 6 is a further schematic representation of an oscillator circuit.

When either adjustment MOSFET 601, 603 in FIG. 6 is turned on at an appropriate point in the oscillator cycle, the resistive part of the RC time constant is effectively reduced so that the oscillator changes state on demand causing a transition in the clock signal. Here, when the data transition occurs while the clock is low, the PMOS 601 is the appropriate MOSFET.

A suitable controller is operable to sense the condition that the clock is low when the data edge appears, assert the PMOS control signal and then clear the control signal once the clock has changed state. In an exemplary embodiment, the controller is implemented using an edge triggered D flip-flop, with a set input. The received data stream provides the flip-flop clock signal and the clock signal provided by the oscillator is connected to the flip-flop data input.

If the clock signal is low when the data rising edge appears, then the output of the flip-flop will also take on a low value, which is the PMOS control signal, and turn it on. If the clock signal derived from the oscillator is also connected to the set input of the flip-flop, then once it has changed state and is high, and the control signal is therefore no longer required, the flip-flop output will be asynchronously set to a high value and hence the control signal will no longer be asserted. The control signal will then remain in a high state while the oscillator clock signal goes into a low state again through the next part of its cycle keeping the PMOS device off.

If the clock signal goes into a high state again just before the next rising edge in the data stream the set input on the flip-flop will be asserted once more, but as the output is already high there will be no change.

The other condition, that the clock signal is already high when a transition in the incoming data occurs, requires the use of an inverted version of the oscillator output, thus re-framing the situation to be that of a data transition occurring when the clock signal is low, as just described. There is a difference in the control signal as in this case the real oscillator (i.e. the non-inverted version) needs to be brought low, which is achieved with another MOSFET, this time the NMOS adjustment MOSFET 603 of FIG. 6. The control signal therefore needs to be brought high to effect the correction and then returned to a low state the rest of the time, which can be achieved similarly to as before but by taking the inverted output from the flip-flop.

Figure 7:
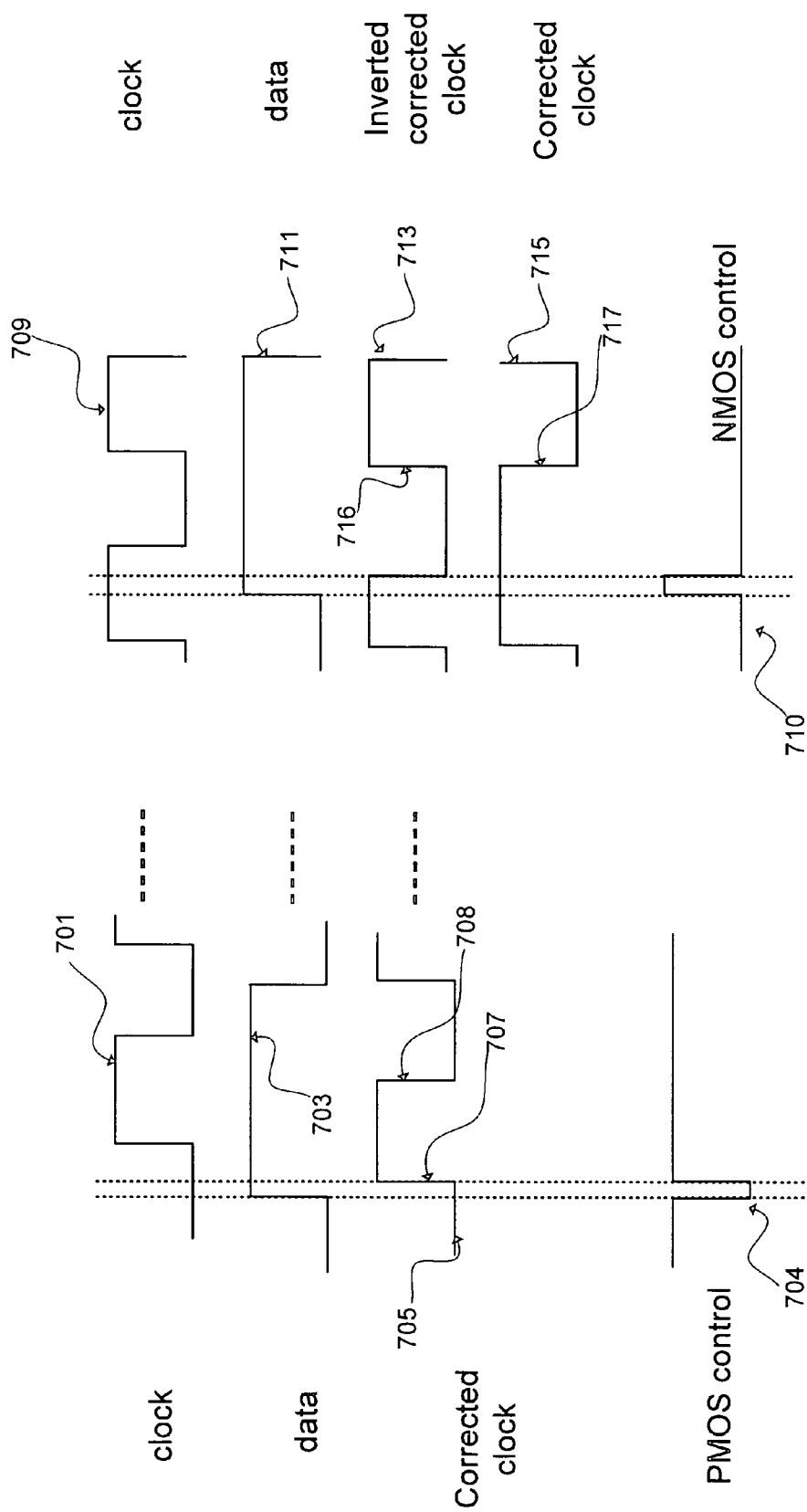
FIG. 7 is a schematic representation of the relative timing between events according to an exemplary embodiment.

FIG. 7 is a diagrammatic representation of the PMOS and NMOS control signals and how they relate to transitions in the data stream and to the state of the clock signal derived from the oscillator. The signal 701 of FIG. 7 represents a clock signal obtained as described above with reference to FIGS. 3 to 6. The signal 703 represents the signal of a bit of an incoming data stream. Here, the rising edge of the bit period occurs when the clock signal is in a low state. A control signal 704 is therefore asserted in order produce a transition of the clock signal 707 substantially at the rising edge of the incoming data stream as depicted by the corrected clock signal 705.

The corrected clock 705 now has a falling edge transition 708 substantially in the center of the bit period of the incoming data stream. The signal 709 of FIG. 7 represents a clock signal obtained as described above with reference to FIGS. 3 to 6. The signal 711 represents the signal of a bit of an incoming data stream. For the signal 711, the rising edge of the bit period occurs when the clock signal 709 is in a high state.

In order to ensure that there is a consistent rising or falling edge clock transition substantially in the center of the bit of the incoming data stream 711, the control signal 710 is asserted. In the case of FIG. 7, it is necessary to have a consistent falling edge clock transition in the center of the bit 711 (since a falling edge transition was used to latch the data for the bit 703).

The control signal 710 therefore forces the oscillator to change state, and hence clock 709. In this respect, an inverted corrected clock signal 713 will be produced as a result of the data bit transition, with the transition 716 at the center of the data bit rising, not falling. Therefore, this signal is inverted in order to provide the corrected clock signal 715 which provides the desired falling edge clock transition 717 substantially in the center of the bit 711. Hence, a consistent falling edge transition of the corrected clock signal is obtained, in which the falling edge will always occur substantially in the center of an incoming data bit to ensure satisfactory data latching.

It will be appreciated by those skilled in the art, that it is possible to use rising edge clock transitions as opposed to the falling edge transitions for the clock signal as described above with reference to FIG. 7. All that is required is that there is consistency of the type of clock transition used to latch the data for the two cases as described, and the above is not intended to be limiting. It will further be appreciated that FIG. 7 is not to scale, and that the relative dispositions of events are depicted only by way of example.

When the corrected clock signal requires inversion, as described above, there must be a selection between the direct and inverted oscillator signals according to whether the synchronization has been done via the PMOS or NMOS control signals. This is advantageously accomplished with a two input multiplexer (MUX), the output of which is selected by the PMOS and NMOS control signals acting through a simple flip-flop. This is implemented with a pair of cross-connected NAND gates, for example, with the set input connected to the PMOS control signal and the reset input connected to an inverted version of the NMOS control signal. This holds the MUX in whichever state has just been set until the next synchronization control pulse arrives, outputting either the direct or inverted oscillator clock signals as appropriate, the result of which being that whenever a rising edge occurs in the data stream, the MUX output is always an oscillator signal that is at the start of a high half-cycle.

The MUX output may provide a clock signal to the previously mentioned divide-by-2 function arrangement. It will be appreciated that a suitable multiplexer may also be effected using suitable arranged NOR gates. In order to ensure that the phase of the division is correct, so that a transition of the divided signal—the proper, desired clock output—occurs in the middle of the data bit, a D flip-flop with a reset input may be used.

According to one embodiment, the reset is asserted by either of the PMOS or NMOS control signals. This ensures that whenever there is a transition in the data stream the flip-flop output (i.e. the divided clock) is low and therefore on the next transition, which will be one oscillator cycle later and in the middle of the bit, the clock output will go high. It will be appreciated that an alternative arrangement may be implemented in which a transition of the clock occurring substantially in the center of a bit is a falling edge transition, such that the clock output goes low.

Figure 8:
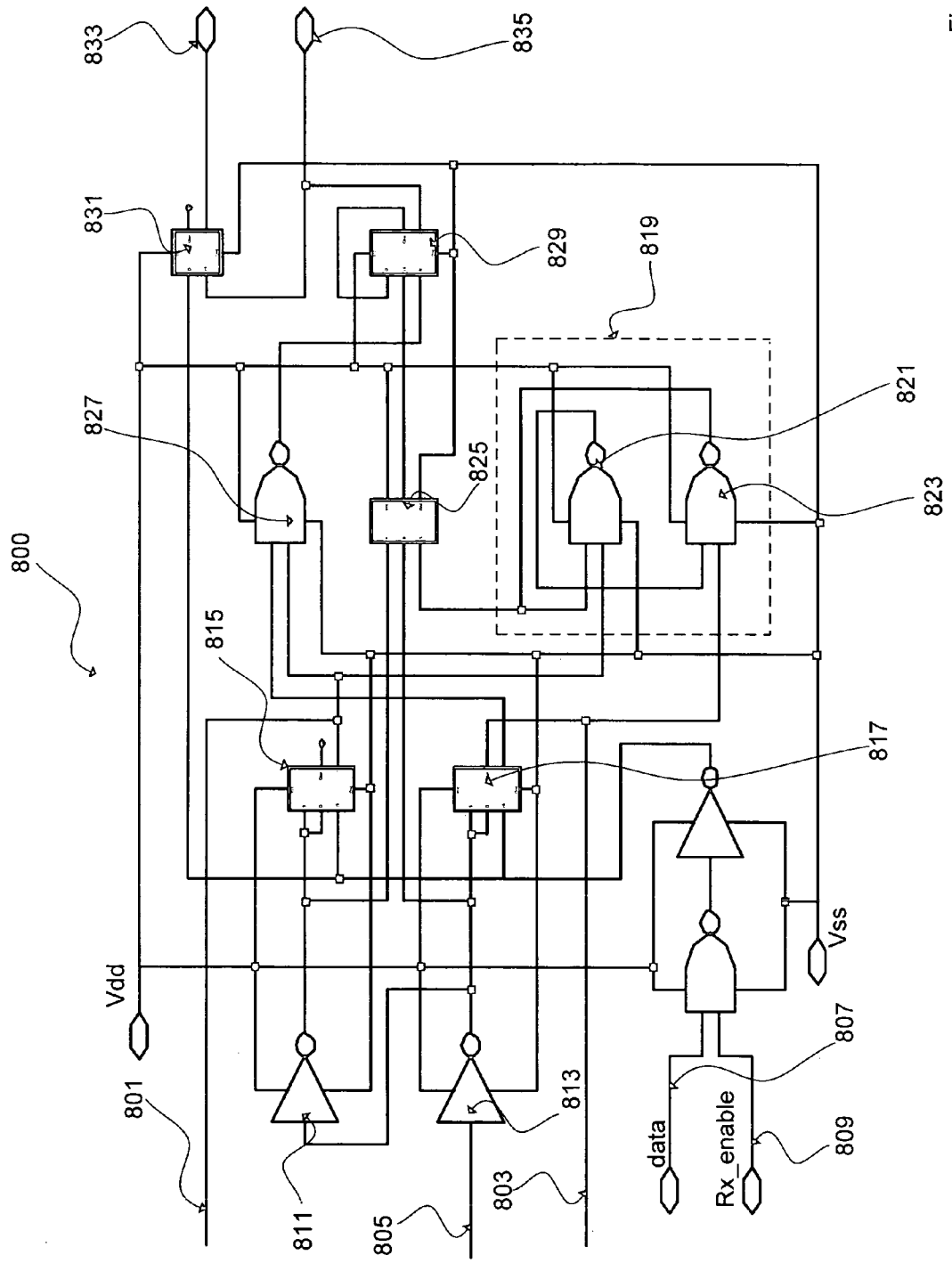
FIG. 8 is a schematic representation of a controller circuit.

A complete control circuit according to an exemplary embodiment is shown in FIG. 8. The connections to the PMOS and NMOS control MOSFETs in the oscillator are 801, 803 respectively. The oscillator input is 805. Also shown are input ports for the data stream 807 that provides the synchronization source and an Rx_enable (receive-enable) signal 809.

Moving through the circuit from the left, first there is a pair of inverters 811, 813, which provide both a buffered direct oscillator signal and also an inverted one. These signals connect to their respective edge triggered D-latches 815, 817, which are also connected to the data stream for synchronization. The control signals from these latches then go into the flip-flop (depicted generally at 819) at the bottom right of the circuit, formed from cross-connected NAND gates 821, 823, the output of which provides the select signal for the MUX 825 in the center of circuit 800. The direct and inverted oscillator signals also go into the MUX 825. Above it is a NAND gate 827 used to generate the reset signal for the divide-by-2 stage, which is implemented using a D-latch with reset 829 on the right hand edge of the circuit. Finally, above the divide-by-2 stage is a simple latch 831 that samples the data stream, so that the two output ports 833, 835 provide synchronized clock and correctly sampled data signals respectively.

Figure 9:
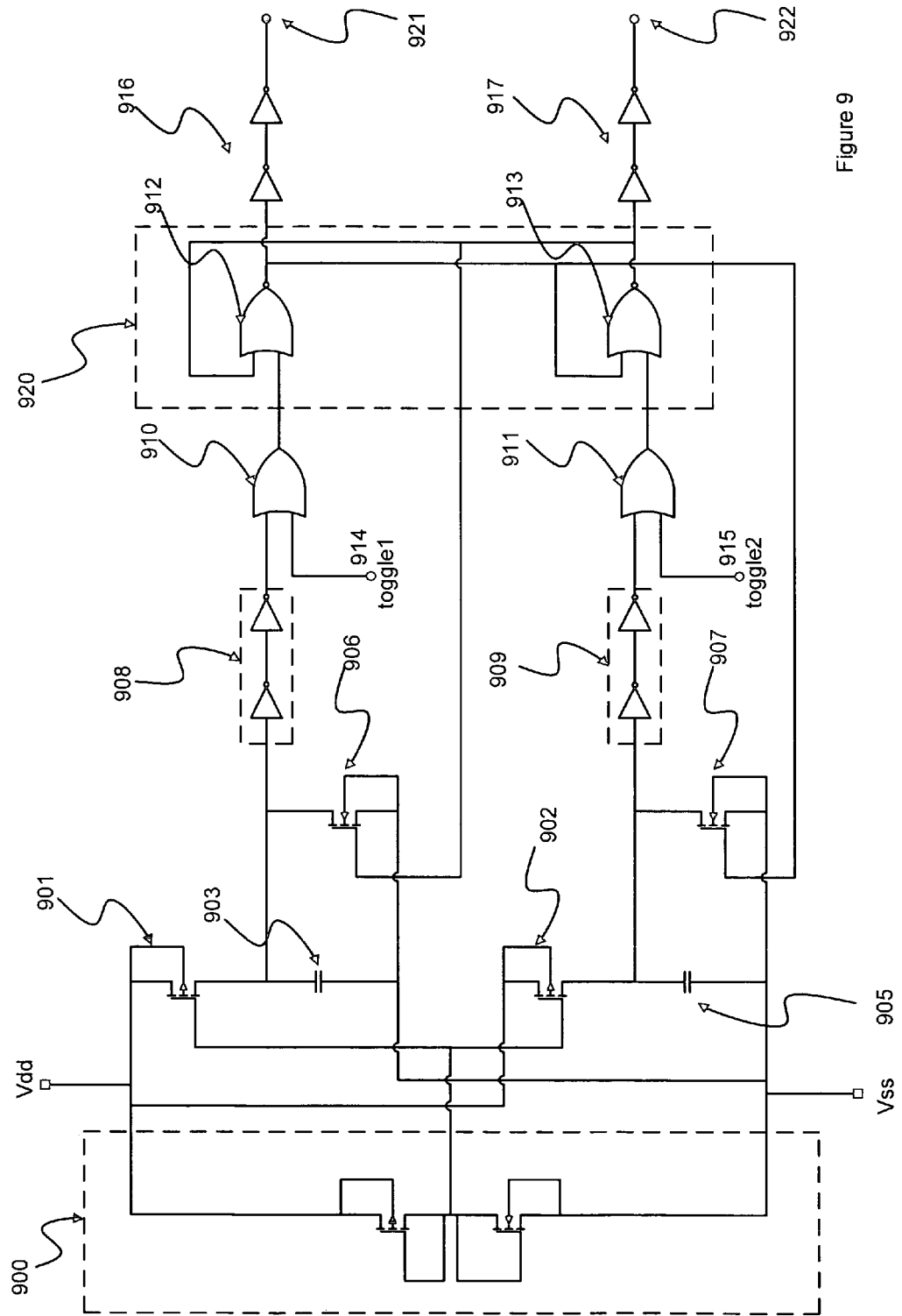
FIG. 9 is a schematic representation of an oscillator circuit according to an embodiment.

An alternative oscillator is depicted schematically in FIG. 9. The circuit 950 of FIG. 9 comprises two parallel sub-circuits that share a common bias circuit 900. Each sub-circuit comprises a PMOS FET 901,902 operable to act as a current source suitable for delivering a steady current to respective capacitors 903,905.

A capacitor 903,905 will charge only if the corresponding NMOS FET 906,907 that is connected across it is turned off. The pairs of inverters 908,909 function as a threshold detector, connected through respective OR gates 910,911 to respective NOR gates 912,913 that are cross-coupled with the corresponding component in the parallel circuit to form a flip-flop, which is generally designated by box 920. The OR gates 910,911 allow external signals 914,915 (toggle1, toggle2) to set or reset the flip-flop 920. Pairs of inverters 916,917 act as buffers on the respective outputs 921,922 of the circuit 950.

The sub-circuits referred to above of FIG. 9 are in the form of current mirrors. The use of current mirrors provides a current source that charges the capacitors at a well-defined rate. As a capacitor 903 charges, the voltage across it increases until it reaches a threshold, at which moment a signal from a detector 908 sets flip-flop 920. One output of set flip-flop 920 turns on FET 906 which reduces the charge on the capacitor 903 to substantially zero, while the other (complementary) output turns off the FET 907 in the parallel sub-circuit. This sub-circuit is then free to charge its capacitor 905, and when it reaches a desired threshold, the detector 909 produces a signal and flip-flop 920 is reset. The FETs 906,907 then swap states, and the process repeats.

In one embodiment, the two parallel circuits are substantially identical. In this case, the duty cycle is substantially 50% and the frequency of oscillation will depend on the bias circuit 900 for the current sources and the size of the capacitors 903,905.

State changes on demand are achieved by inserting OR gates 910,911 between the outputs of the threshold detectors 908,909 (the two pairs of cascaded inverters) and the flip-flop 920, so that in addition to the capacitors 903,905 charging to their respective trigger levels, external signals 914,915 can also set or reset the flip-flop 920. A control circuit is operable to route a state change signal to the appropriate OR gate at any given instant.

Figure 10:
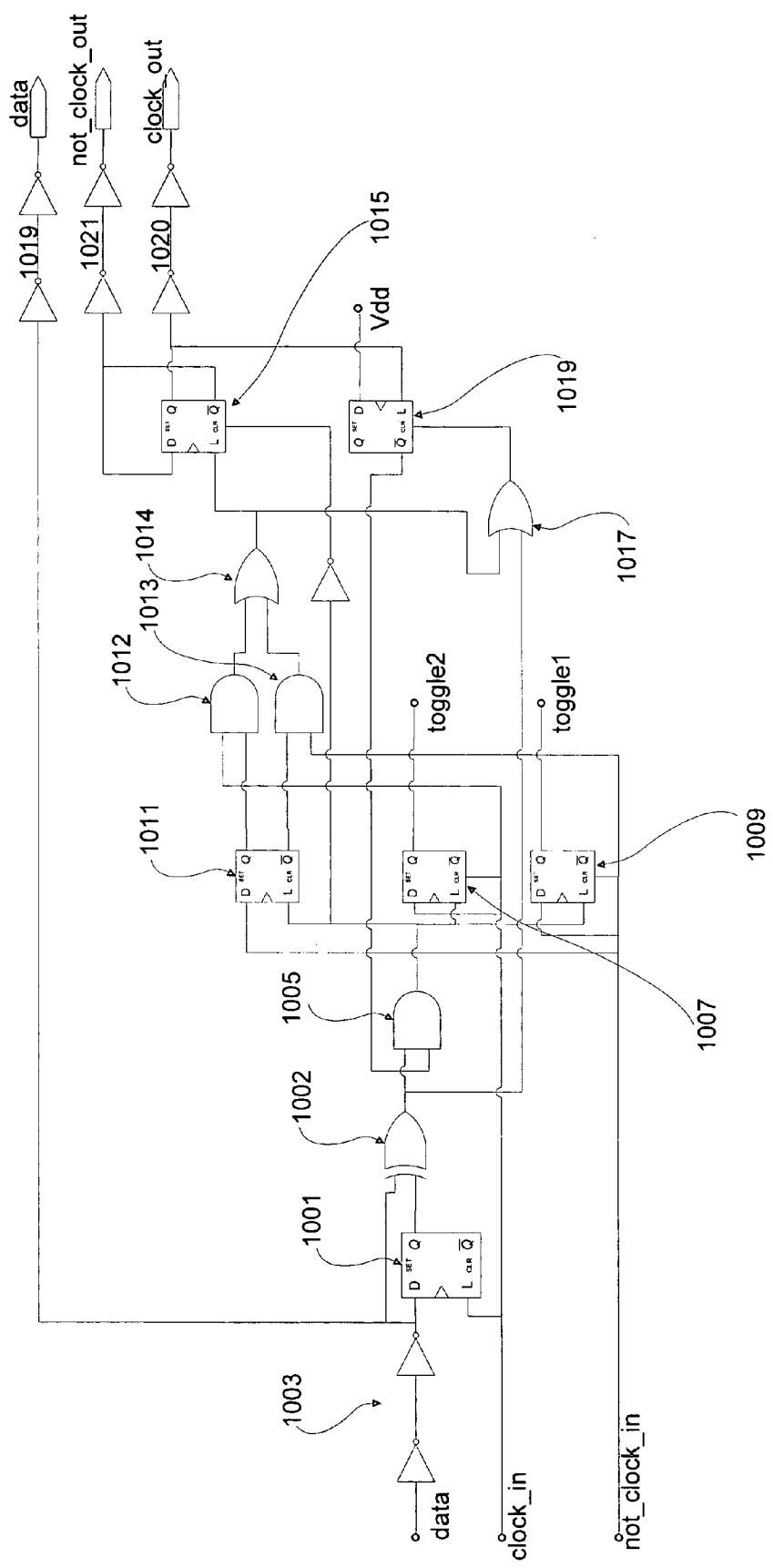
FIG. 10 is a schematic representation of a control circuit according to an embodiment.

A suitable control circuit 1000 is schematically depicted in FIG. 10 of the accompanying drawings. The control circuit 1000 is operable to effect a change of state in a clock signal generated by the oscillator circuit of FIG. 9 in response to a transition in a digital data stream.

In order to determine where transitions in a digital data stream occur, the stream is sampled and the value is stored in a latch 1001. When the stored value differs from the instantaneous value of the incoming digital data stream, an XOR gate 1002 is operable to generate a synchronization pulse, which is routed to the appropriate toggle input (914,915) of the oscillator, depending on whether its output is in a high or a low state at that instant.

Because forced transitions of the oscillator may result in a clock with very narrow half-cycles which can cause problems, in one embodiment the oscillator is adapted to run (oscillate) at a frequency of twice that of the desired clock frequency to allow for suitable logic circuitry to smooth over any undesirable events. In one embodiment, the output stage of the control circuit 1000 comprises a D flip-flop 1015 fed back on itself to effect a divide by 2 operation. The clock is the output from this flip-flop. Each synchronization pulse resets the divider 1015 so that the clock is low at the start of a bit and then has a low-to-high transition near the center. Whether the divider 1015 is driven by the direct oscillator output or its inverse depends on the phase of the oscillator when the data transition occurs. At the same time as the synchronization pulse is routed to the correct toggle input (914,915) of the oscillator of FIG. 9, a suitable multiplexer (in the form of AND gates 1012,1013 and OR gate 1014) selects either the direct or the inverted signal for the divider 1015.

Figure 11:
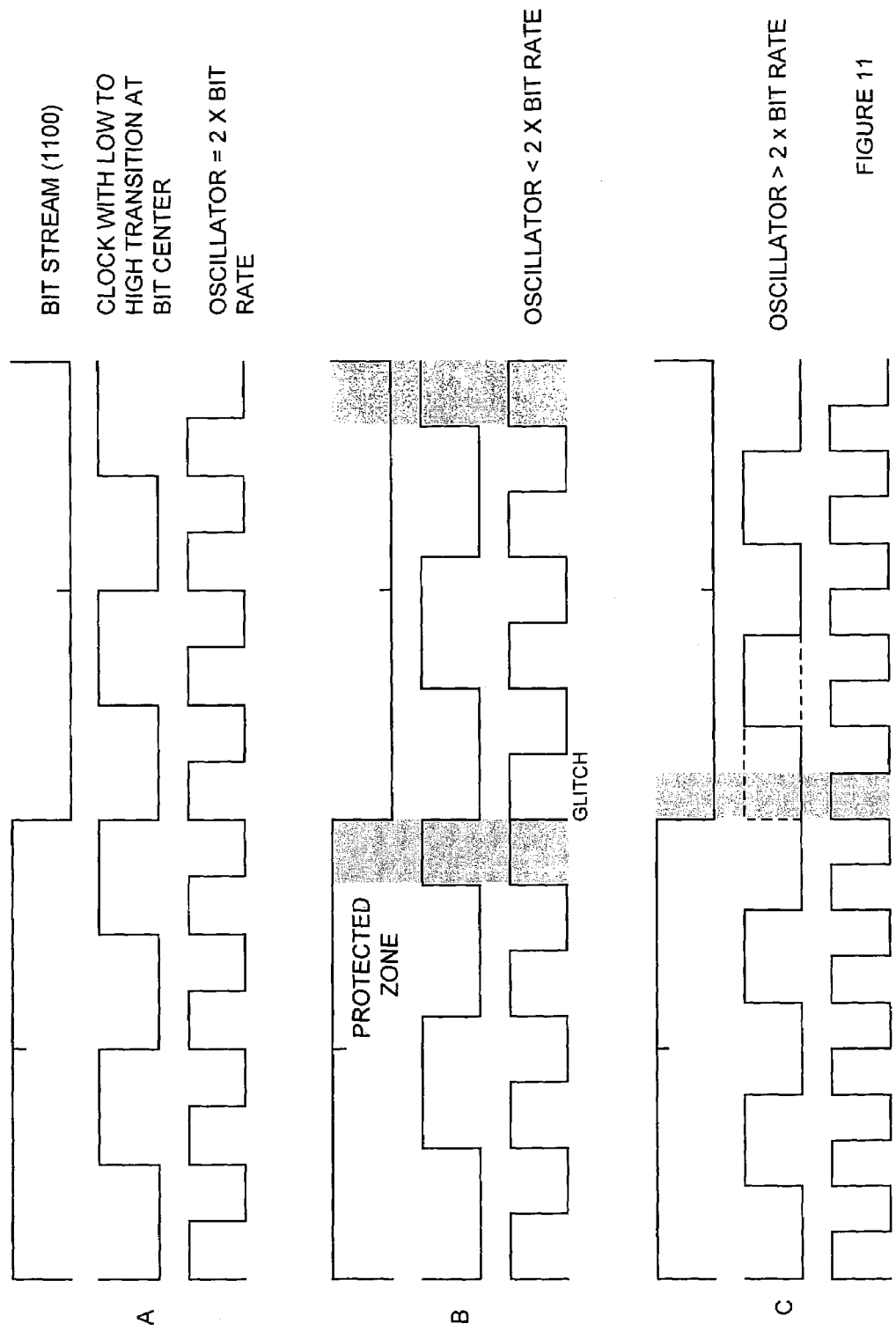
FIG. 11 is a schematic representation of the relative timing between events according to the embodiment exemplified by FIGS. 9 and 10.

FIG. 11 is a set of timing diagrams relating to the control circuit of FIG. 10. It will be appreciated that FIG. 11 is not to scale, and that the relative dispositions of events are depicted only by way of example. The top set of traces, A, shows the situation where the clock has a transition in the center of each bit of a data stream. The oscillator runs at substantially twice the bit rate of the date stream.

In the middle set of traces, B, the oscillator runs slower than twice the bit rate, such that after 2 bits only 3.5 oscillator cycles have occurred instead of 4 as in A. The data in the data stream changes from high to low (binary value 1 to binary value 0 for example) which causes a synchronization pulse, which resets the divider to bring the clock low at the start of the first 0 bit and also forces a state change in the oscillator. If the oscillator had just managed to change state itself before this synchronization pulse, then it would be low momentarily before immediately going high again, resulting in the glitch shown in trace B of FIG. 11. It is a feature of the timing of the synchronization pulse, that when the divider flip-flop is reset the aforementioned glitch is contained. If the oscillator was even slower, then the data transition would occur in the shaded protected zone, leading to an even shorter positive half-cycle of the clock. Eventually this could cause problems as it would become too short for a processor utilizing the clock signal to complete all that it needs to during the clock high interval, leading to a processor getting into an undefined state. To prevent this from happening any data transitions that occur in a protected zone do not cause state changes in the oscillator or affect the clock. The result will be a loss of synchronization and errors in the received data stream, but any processor will be able to function properly and handle the situation correctly.

In the bottom set of traces, C, the oscillator runs faster than twice the bit rate and 5 oscillator cycles occur in 2 bits of the data stream instead of 4 as in A. If the oscillator has not changed state itself at the moment when the data transition causes the synchronization pulse, then it will be forced high. Normally this rising edge would also produce a change in the clock, as shown by the dotted line in C, but then the clock would not be in a low state at the start of the bit, ready for the rising edge near the middle. The fact that the synchronization pulse also resets the divider flip-flop ensures that the clock remains in a low state at the bit transition. If the oscillator has already changed to a high state when the synchronization pulse occurs, and therefore the clock is also high, the result would be for the clock to be reset immediately to a low state again, causing the same problems with short duration half-cycles as discussed previously. Therefore, there is another protected zone shown in the bottom set of traces C.

Advantageously, an incoming data stream is Manchester encoded. The use of Manchester encoding ensures that the longest run of data bits of the data stream before a transition occurs is only 2. This maximizes the permissible difference in frequency between the oscillator and the bit/data stream, illustrated by traces B and C, such that the scheme still works.

In relation to the control circuit of FIG. 10, a data stream comes from the left, is buffered using, for example a cascaded pair of inverters 1003, sampled with the latch 1001 and then compared with itself in the XOR gate 1002 to provide synchronization pulses with rising edges whenever the data changes. The AND gate 1005 that follows is used to block the synchronization pulse within the protected zones. The bottom 2 edge triggered flip-flops 1007,1009 sample the state of the direct and inverted oscillator outputs (labeled clock_in and not_clock_in) on the rising edge of the synchronization pulse; only one of them can be high at any one time, so only one toggle output (toggle1, toggle2 corresponding respectively to 914,915 of FIG. 9) will be asserted. When the oscillator has changed state, the output which had just been high will be low, resetting the relevant flip-flop 1007,1009 and thus clearing the toggle signal. The top edge triggered flip-flop 1011 also samples the oscillator output on the rising edge of the synchronization pulse and is used in conjunction with the 2 AND 1012,1013 and 1 OR gate 1014 following it (which act as a multiplexer) to deliver an appropriately phased signal to the divider flip-flop 1015. If this were not done then the rising edge of the clock might occur ¼ of the way into the bit instead of ½ for example. Finally, the OR gate 1017 and flip-flop 1019 with its data input tied high are used to generate an inhibit signal during the protected zones. The data, clock and inverted clock signals (data, clock_out, not_clock_out) are all buffered on output using suitable buffering means such as the pairs of cascaded inverters 1019,1020,1021.

Figure 12:
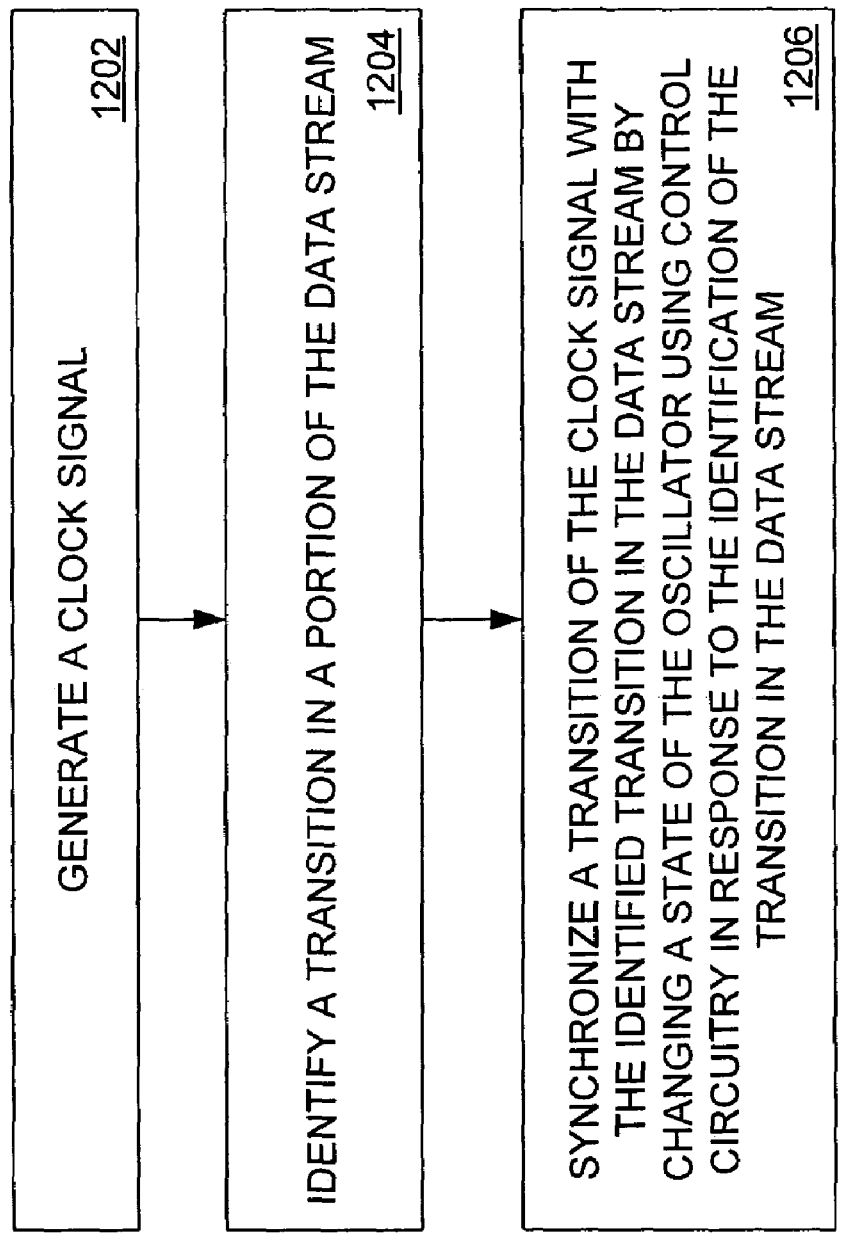
FIG. 12 is a flowchart diagram describing the functionality of one embodiment of the present disclosure.

FIG. 12 is a flow chart illustrating one embodiment of a method for generating a clock signal and synchronizing the generated clock signal with a digital data stream. The process illustrated in flow chart 1200 (FIG. 12) begins at block 1202. At block 1202, a clock signal is generated using an oscillator (e.g., FIG. 3). At block 1204, a transition in a portion of the data stream is identified, as previously described. At block 1206, a transition of the clock signal is synchronized with the identified transition in the data stream by changing a state of the oscillator using control circuitry in response to the identification of the transition in the data stream. Note, the clock signal is synchronized with the data stream for both situations where (a) the oscillator operates at a frequency greater than the data rate and (b) where the oscillator operates a frequency less than the data rate.

Figure 13:
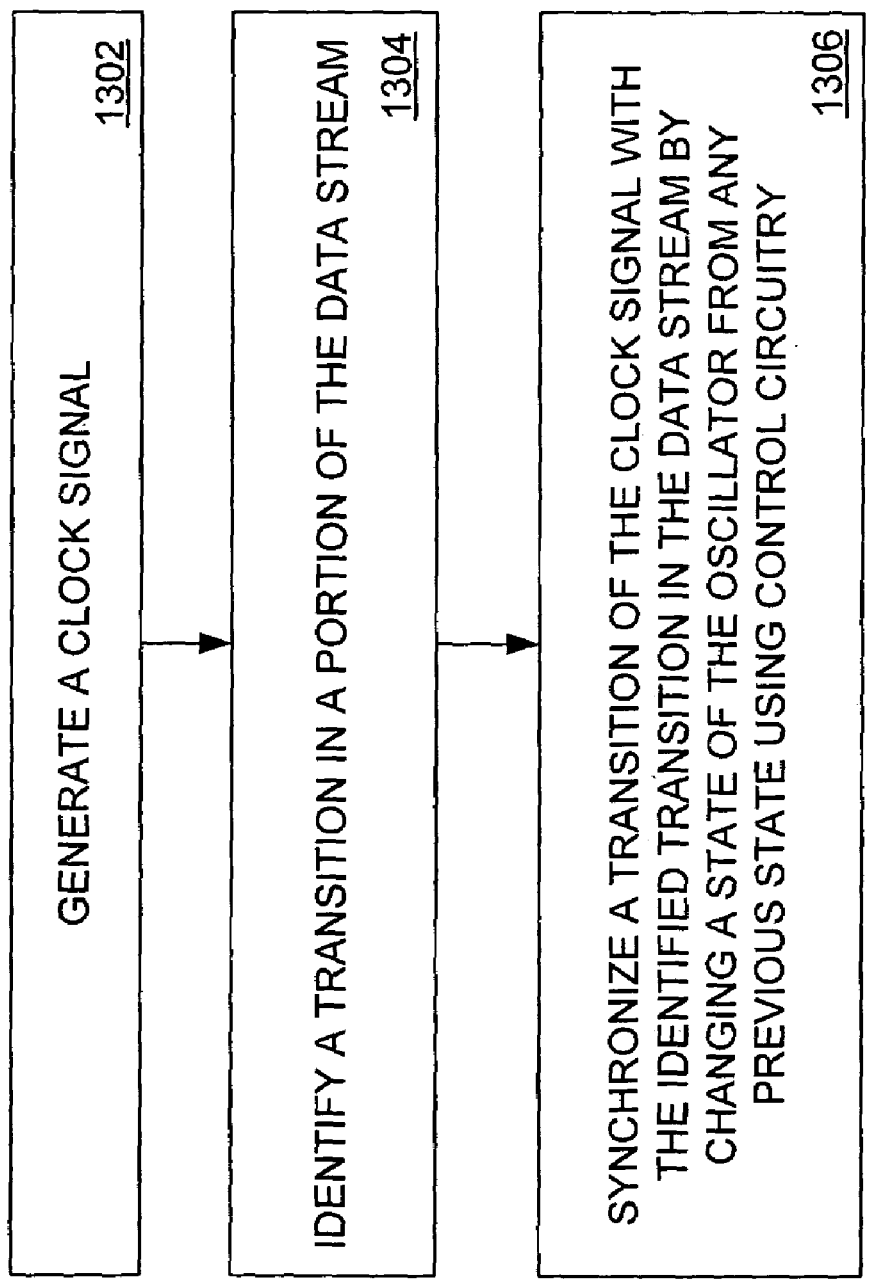
FIG. 13 is a flowchart diagram describing the functionality of one embodiment of the present disclosure.

FIG. 13 is a flow chart illustrating one embodiment of a method of generating a clock signal for use by an inductively powered circuit, and synchronizing the generated clock signal with a digital data stream. The process illustrated in flow chart 1300 (FIG. 13) begins at block 1302. At block 1302, a clock signal is generated using an oscillator (e.g., FIG. 3). At block 1304, a transition in a portion of the data stream is identified, as previously described. Then, at block 1306, a transition of the clock signal is synchronized with the identified transition in the data stream by changing a state of the oscillator from any previous state using control circuitry in response to the identification of the transition in the data stream, as previously discussed.

Each block of the flow charts of FIGS. 12 and 13 may represent a module, segment or portion of code, which comprises one or more executable instructions for implementing the specified logical function(s). It should also be noted that in alternative embodiments, the functions noted in the blocks may occur out of the order noted in the figure or may include additional functions. For example, two blocks shown in succession in FIG. 12 and/or FIG. 13 may in fact be substantially executed concurrently, the blocks may sometimes be executed in the reverse order, or some of the blocks may not be executed in all instances, depending upon the functionality involved. All such modifications and variations are intended to be included herein within the scope of this disclosure.

It should be emphasized that the term "comprises/comprising" when used in this specification specifies the presence of stated features, integers, steps or components but does not preclude the presence or addition of one or more other features, integers, steps, components or groups thereof.

Furthermore, when reference is made in this specification to particular electronic circuit designs, elements, components and constructions, particularly when described with reference to the drawings, it should be noted that these are provided merely as an aid to the understanding of the present disclosure, and are not intended to be limiting. It will be appreciated by those skilled in the art that electronic circuit designs and constructions such as those set forth herein may be implemented in numerous alternative fashions to those given using different elements and/or components without any loss of functionality or substantial difference in size and/or power requirements. In particular, aspects of the present disclosure are described with reference to the use of metal oxide semiconductor field effect transistors (MOSFETs). It will be appreciated by those skilled in the art, that such devices may be replaced by elements with substantially similar functionality such as bipolar junction transistors for example without any loss of functionality.

It should be emphasized that the above-described embodiments of the present disclosure are merely possible examples of implementations, merely set forth for a clear understanding of the principles of the disclosure. Many variations and modifications may be made to the above-described embodiment(s) of the disclosure without departing substantially from the spirit and principles of the present disclosure. All such modifications and variations are intended to be included herein within the scope of this disclosure.

Therefore, having thus described the invention, at least the following is claimed:

1. A digital electronic circuit comprising:
   a timing element for generating a clock signal for the circuit; and
   a controller for synchronizing the clock signal with a received digital stream in response to an identification of a transition in the digital data stream, wherein:
   the clock signal is synchronized with the received digital stream for both situations where the timing element operates at a frequency greater than twice a data rate of the received digital stream and where the timing element operates a frequency less than the twice a data rate of the received digital stream; and
   the timing element comprises first and second current mirrors arranged in association with one another in order to effect generation of the clock signal; and
   first and second capacitors respectively connected to first and second current mirrors, wherein a current mirror is adapted to provide a respective capacitor with a substantially constant current in order that the capacitor charges to a threshold voltage value, the circuit further comprising a suitable switch arrangement adapted to effect discharge of the capacitor charged to its respective threshold voltage value, and charging of the other capacitor; and a first switch and a second switch, the first and second switches arranged in association with the timing element and operable to effect a change of state of the timing element in response to a control signal.

2. The digital electronic circuit of claim 1, wherein the switch arrangement is further operable to respond to the identification of a transition in the digital data stream in order to effect discharge of the capacitor charging to its respective threshold value.

3. An inductively powered circuit adapted to receive a digital data stream, the circuit comprising:
   a timing element for generating a clock signal for the circuit, wherein the timing element comprises first and second current mirrors arranged in association with one another in order to effect generation of the clock signal;
   a controller for synchronizing the clock signal with at least a portion of the received digital stream by changing a state of the timing element from any previous state in response to an identification of a transition in the digital data stream; and
   first and second capacitors respectively connected to first and second current mirrors, wherein a current mirror is adapted to provide a respective capacitor with a substantially constant current in order that the capacitor charges to a threshold voltage value, the circuit further comprising a suitable switch arrangement adapted to effect discharge of the capacitor charged to its respective threshold voltage value, and charging of the other capacitor; and a first switch and a second switch, the first and second switches arranged in association with the timing element and operable to effect a change of state of the timing element in response to a control signal.

4. The inductively powered circuit of claim 3, wherein the switch arrangement is further operable to respond to the identification of a transition in the digital data stream in order to effect discharge of the capacitor charging to its respective threshold value.

5. The inductively powered circuit of claim 3, wherein the inductively powered circuit is an RFID tag.

* * * * *